United States Patent
Hsu et al.

(10) Patent No.: US 7,214,583 B2
(45) Date of Patent: May 8, 2007

(54) MEMORY CELL WITH AN ASYMMETRIC CRYSTALLINE STRUCTURE

(75) Inventors: Sheng Teng Hsu, Camas, WA (US);
Tingkai Li, Vancouver, WA (US);
David R. Evans, Beaverton, OR (US);
Wei-Wei Zhuang, Vancouver, WA (US); Wei Pan, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 126 days.

(21) Appl. No.: 11/130,983

(22) Filed: May 16, 2005

(65) Prior Publication Data
US 2005/0207265 A1 Sep. 22, 2005

Related U.S. Application Data

(62) Division of application No. 10/442,749, filed on May 21, 2003, now Pat. No. 6,927,120.

(51) Int. Cl.
*H01L 21/8242* (2006.01)
(52) U.S. Cl. ........................ 438/250; 438/251; 438/393
(58) Field of Classification Search .................... 438/3, 438/240, 250–253, 393–394; 257/295
See application file for complete search history.

(56) References Cited

U.S. PATENT DOCUMENTS

2003/0104667 A1\* 6/2003 Basceri ........................ 438/240

\* cited by examiner

*Primary Examiner*—Dung A. Le
(74) *Attorney, Agent, or Firm*—Law Office of Gerald Maliszewski; Gerald Maliszewski

(57) ABSTRACT

Asymmetrically structured memory cells and a fabrication method are provided. The method comprises: forming a bottom electrode; forming an electrical pulse various resistance (EPVR) first layer having a polycrystalline structure over the bottom electrode; forming an EPVR second layer adjacent the first layer, with a nano-crystalline or amorphous structure; and, forming a top electrode overlying the first and second EPVR layers. EPVR materials include CMR, high temperature super conductor (HTSC), or perovskite metal oxide materials. In one aspect, the EPVR first layer is deposited with a metalorganic spin coat (MOD) process at a temperature in the range between 550 and 700 degrees C. The EPVR second layer is formed at a temperature less than, or equal to the deposition temperature of the first layer. After a step of removing solvents, the MOD deposited EPVR second layer is formed at a temperature less than, or equal to the 550 degrees C.

17 Claims, 3 Drawing Sheets

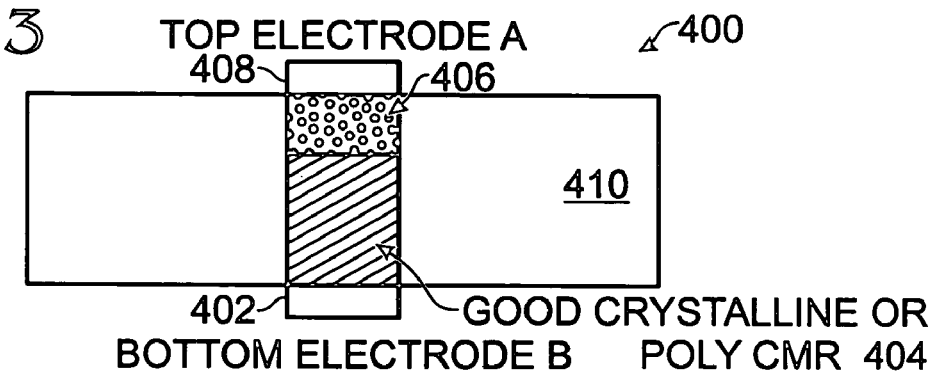
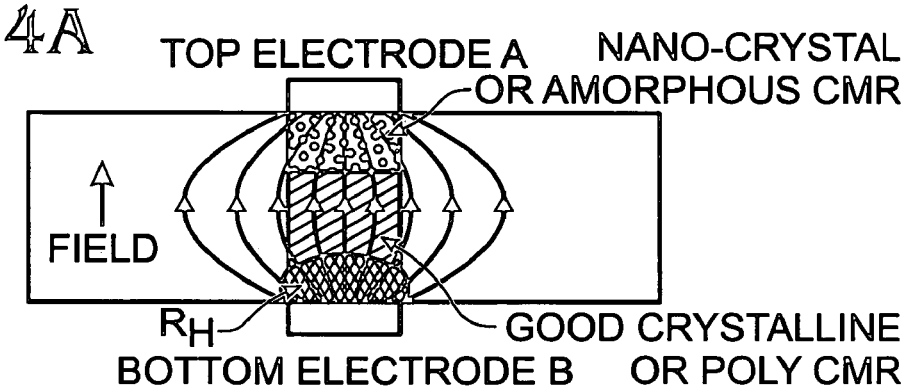
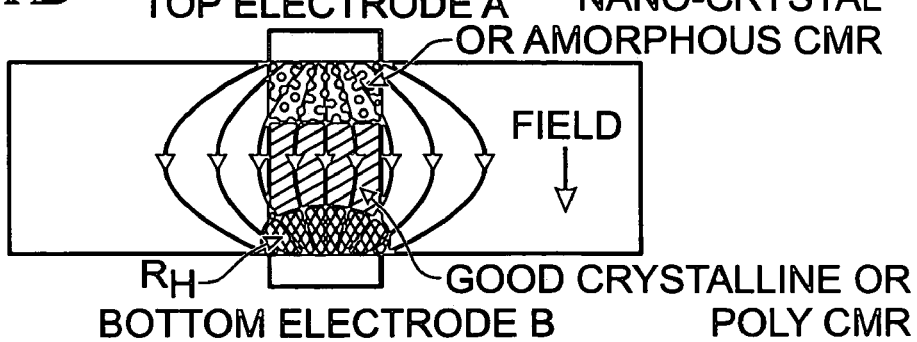

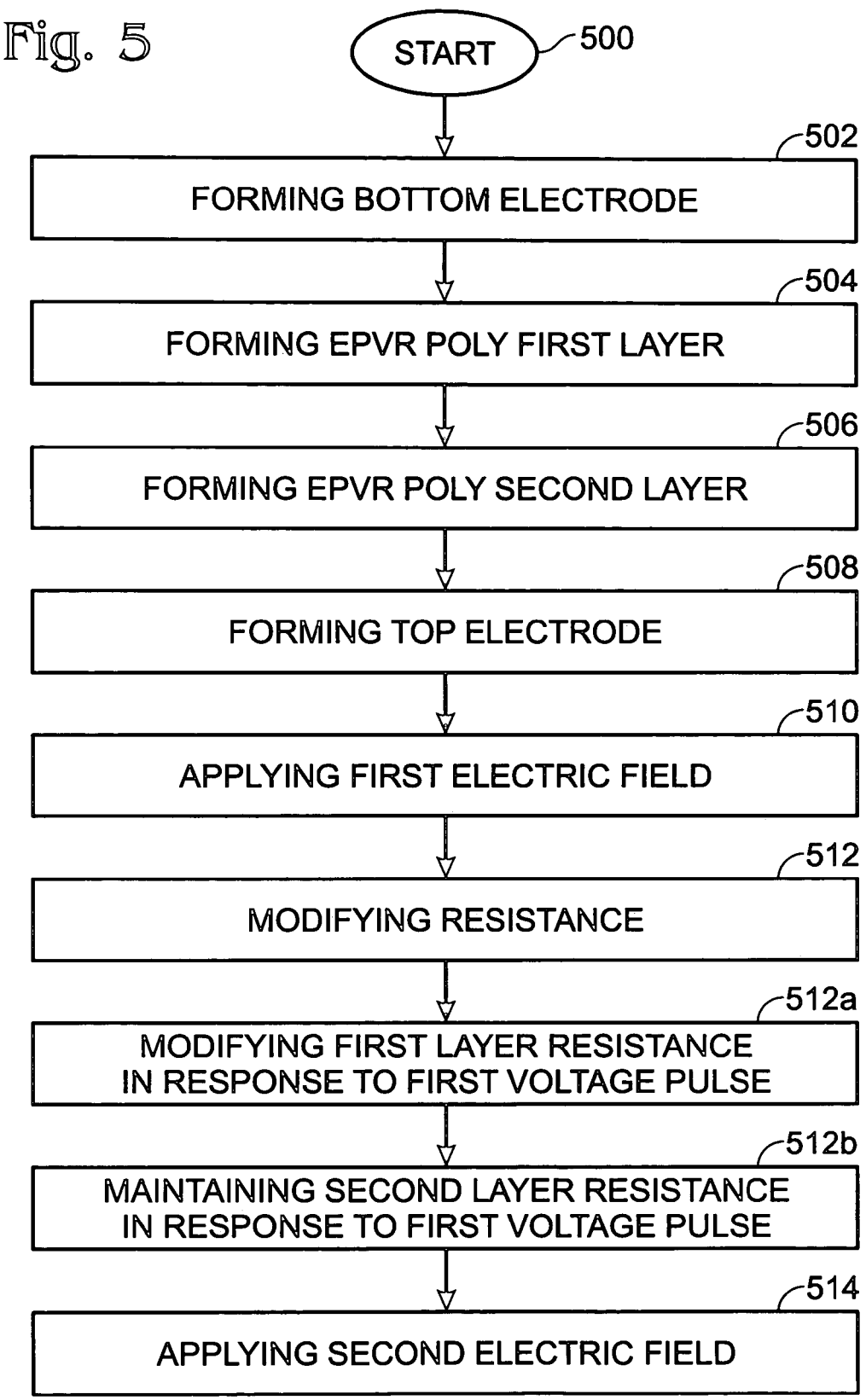

MEMORY CELL WITH AN ASYMMETRIC CRYSTALLINE STRUCTURE

RELATED APPLICATIONS

This application is a Divisional Application of a pending patent application entitled, METHOD FOR FORMING AN ASYMMETRIC CRYSTALLINE STRUCTURE MEMORY CELL, invented by Hsu et al., Ser. No. 10/442,749, now U.S. Pat. No. 6,927,120, filed May 21, 2003, which is incorporated herein by reference.

BACKGROUND OF THE INVENTION

1. Field of the Invention

This invention generally relates to integrated circuit (IC) memory devices and, more particularly, to an asymmetric crystalline structure memory resistor cell and a method for fabricating the same.

2. Description of the Related Art

Conventionally, memory cells using a memory resistor material, such as colossal magnetoresistance (CMR) materials, are fabricated with large unpatterned conductive bottom electrodes, unpatterned CMR material, and relatively small top electrodes. These devices work in limited applications, but they are not suitable for dense memory array applications because of relatively large size of the cells.

The CMR material can be said to have a non-volatile nature, as the resistance of the CMR material remains constant under most circumstances. However, when a high electric field induces current flow through the CMR material, a change in the CMR resistance can result. During a programming process, the resistivity of the memory resistor at the high field region near the electrode changes first. Experimental data shows that the resistivity of the material at the cathode, referred as terminal A, is increased while that at the anode, referred as terminal B, is decreased. During the erase process the pulse polarity is reversed. That is, the designation of cathode and anode are reversed. Then, the resistivity of the material near terminal A is decreased, and the resistivity near terminal B is increased.

As the demand increases for cell memory, there is increased motivation to reduce the size of cells in the array. However, smaller feature sizes make the device more susceptible to process tolerance errors. Due to process tolerances, extremely small physically asymmetrical devices may not even be practical. However, an analysis (presented below) shows that fabricated memory cells that are sufficiently symmetrical will not work properly. Even if these geometrically symmetric devices can be programmed, the net resistance change from high resistance-state to low resistance-state may be relatively low. It may be possible to build memory cells with enough geometric asymmetry to guarantee significant resistance state changes despite process tolerancing. However, such a design would increase the number and complexity of fabrication steps.

It would be advantageous if features could be designed in a memory resistor memory cell to permit proper programming and erasing operations despite the device's geometric symmetry.

SUMMARY OF THE INVENTION

The present invention describes a thin film resistance memory device suitable for non-volatile memory array and analog resistance applications. The present invention memory cell can be reliably programmed, even if fabricated as a resistive non-volatile, ultra small size, geometrically symmetric structured memory cell. The invention relies upon an asymmetric crystalline structure.

Accordingly, a method is provided for forming an asymmetric crystalline structure memory cell. The method comprises: forming a bottom electrode; forming an electrical pulse various resistance (EPVR) first layer having a polycrystalline structure over the bottom electrode; forming a EPVR second layer adjacent the first layer, having either a nano-crystalline or amorphous structure; and, forming a top electrode overlying the EPVR first and second layers. For example, the second layer may overlie the first layer. Examples of EPVR materials include CMR, high temperature super conductor (HTSC), or perovskite metal oxide materials.

In one aspect of the method, the EPVR first layer is deposited with a metalorganic spin coat (MOD) process at a temperature in the range between 550 and 700 degrees C. Forming an EPVR second layer adjacent the first layer generally means forming the second layer at a temperature less than, or equal to the deposition temperature of the first layer. Therefore, after an additional step of heating the MOD deposited EPVR first layer to remove solvents, the MOD deposited EPVR second layer is formed at a temperature less than, or equal to the 550 degrees C.

The method further comprises: applying an electric field to the EPVR first and second layers; and, selectively modifying the resistance of the EPVR first and second layers in response to the pulse width of the electric field. More specifically, the resistance through the EPVR first layer is modified in response to a first pulsed electric field with a pulse width of less than 400 nanoseconds (ns). However, the resistance through the EPVR second layer remains constant in response to the first pulsed electric field.

In other aspects, the method comprises: applying a second pulsed electric field, having a longer pulse width than the first electric field, to the EPVR first and second layers; and, creating a low-resistance region in the EPVR first and second layers in response to the second pulsed electric field.

Additional details of the above-described method and an asymmetric crystalline structure memory cell are presented below.

BRIEF DESCRIPTION OF THE DRAWINGS

FIG. 3 is a partial cross-section view of the present invention asymmetric crystalline structure memory cell.

FIGS. 4A and 4B illustrate the programming of the present invention memory cell to low-resistance and high-resistance states, respectively.

FIG. 5 is a flowchart illustrating the present invention method for forming an asymmetric crystalline structure memory cell.

DETAILED DESCRIPTION OF THE PREFERRED EMBODIMENTS

Figure 1A:
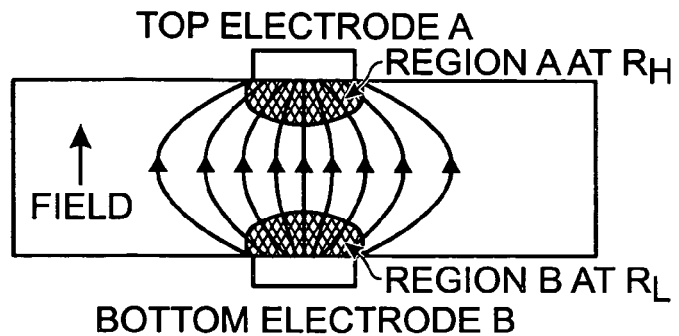
FIGS. 1A and 1B are partial cross-sectional views of a memory cell during programming (FIG. 1A) and erasing (FIG. 1B) operations.
Figure 1B:
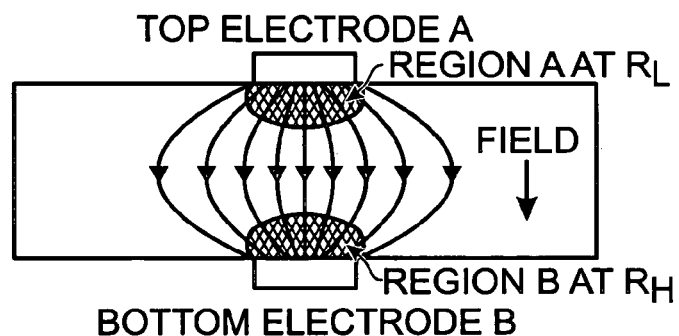

FIGS. 1A and 1B are partial cross-sectional views of a memory cell during programming (FIG. 1A) and erasing (FIG. 1B) operations. The top and bottom electrodes are identical and the memory resistance material is uniform throughout. If the geometric structure of the device could be made perfectly symmetrical, the net resistance would remains constant, in a high-resistance state, when either a negative field (FIG. 1A) or a positive field (FIG. 1B) is applied. Note that the electric fields are defined with respect to the top electrode. That is, the fields are induced at the top electrode. In such circumstances, programming is not possible. Therefore, a geometrically symmetrical device structure, such as one in FIGS. 1A and 1B, is not practical.

More specifically, the geometrically symmetric memory cell has a high current density near the electrodes (regions A and B), and a low current density in the center portion of the device, in the presence of an electric field. As a result, the resistivity of the CMR material near the top and bottom electrodes is changed. For example, the memory cell can be programmed to be in the high-resistance state if the resistivity of the memory resistor material near the top electrode is increased, and the resistivity of memory resistor material near the bottom electrode is decreased. When the polarity of the electric pulse applied to top electrode is reversed (becomes a positive pulse, FIG. 1B), the material near the top electrode (Region A) becomes low resistance (RL), while the material near the bottom electrode (Region B) becomes high resistance (RH). However, the overall resistance of the memory resistance remains the same, still in the high-resistance state. Therefore, it is not possible to program the memory resistor to the low-resistance state.

Since region A and region B are very close to the top and bottom electrode, respectively, and their thicknesses may be as thin as a 10 nanometers (nm), the above-described effect may be mistakenly classified as an interface effect. However, memory is not an interface property change, but is a bulk resistivity change.

Figure 2A:
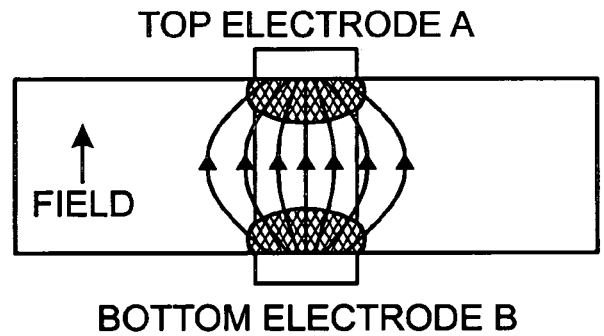
FIGS. 2A and 2B are partial cross-sectional views of a memory cell, where the memory resistor has a cylindrical shape and is embedded in oxide or any suitable insulator.
Figure 2B:
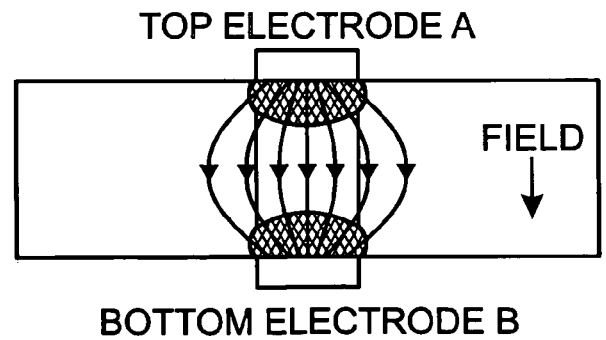

FIGS. 2A and 2B are partial cross-sectional views of a memory cell, where the memory resistor has a cylindrical shape and is embedded in oxide or any suitable insulator. The field intensity is high near both top and bottom electrodes. Since the field direction near the top electrode is opposite that near the bottom electrode, the resistivity of the memory resistor material near the top electrode is increased while the resistivity of the memory resistor material near the bottom electrode is reduced. As a result, the memory resistance is programmed to the high-resistance state regardless of whether a positive or negative pulse is applied to the top electrode. Again, a geometrically symmetrical structure is not suitable for resistor memory cell.

FIG. 3 is a partial cross-section view of the present invention asymmetric crystalline structure memory cell. The present invention describes a memory cell that may be geometrically symmetrical in the sense that memory film is not dependent upon asymmetrical geometric device features to insure proper memory (resistance change) operation. Alternately stated, the film relies upon physically asymmetric features in the structure of the material to insure reliable memory properties.

The cell 400 comprises a bottom electrode 402 and an EPVR material first layer 404 having a polycrystalline structure overlying the bottom electrode 402. An EPVR second layer 406 is adjacent the first layer 404, having either a nano-crystalline or amorphous structure. For example (as shown), the second layer 406 may overlie the first layer 404. Alternately (not shown), the first layer 404 may overlie the second layer 406. A top electrode 408 overlies the EPVR first and second layers 404/406. The cell 400 may be embedded in an oxide or other electrically insulating material 410.

The EPVR first and second layers 404/406 are a material such as CMR, HTSC, or perovskite metal oxide materials. The bottom electrode 402 is a material such as Pt, TiN, TaN, TiAlN, TaAlN, Ag, Au, or Ir. Likewise, the top electrode 408 can be Pt, TiN, TaN, TiAlN, TaAlN, Ag, Au, or Ir.

A nano-crystalline structure is understood to mean a polycrystalline structure where the average grain size is in the nanometer range, smaller than a nanometer, or has a poorer crystalline structure than the polycrystalline structure of layer 404. The EPVR first layer 404 and the EPVR second layer 406 have a selectable resistance responsive to a pulsed electric field. That is, the overall or composite resistance is selectable.

In one aspect, the EPVR first layer 404 has a selectable resistance responsive to a first pulsed electric field. In some aspects, the EPVR first layer 404 has a resistance that is selectable within a range of 100 ohms to 10 megaohms (Mohms), in response to applying a negative first electric field in the range of 0.1 megavolts per centimeter (MV/cm) to 0.4 MV/cm. In other aspects, the EPVR first layer 404 has a resistance that is selectable within a range of 100 ohms to 1000 ohms, in response to applying a positive first electric field in the range of 0.1 megavolts per centimeter (MV/cm) to 0.4 MV/cm. As used herein, the field direction is defined from the perspective of the electrode in contact with the EPVR second layer 406. As shown in FIG. 4A, the negative field direction is from the bottom electrode towards the top electrode, when the EPVR second layer is in contact with the top electrode.

The EPVR second layer 406 has a constant resistance responsive to the first pulsed electric field (either positive or negative). That is, the resistance of the EPVR second layer 406 does not change in response to the first electric field. Typically, the EPVR second layer 406 has a resistance that changes by less than a factor of 2, in response to first pulsed electric field. In some aspects, the first electric field has a pulse width of less than 400 nanoseconds (ns). In other aspects, the first electric field has a pulse width in the range of 1 ns to 400 ns.

The EPVR first layer 404 has a low-resistance region responsive to a second pulsed electric field, where the second pulsed electric field has a longer pulse width than the first electric field. Note that the low-resistance region is formed regardless of whether the second electric field is positive or negative. The first EPVR layer 404 has a low-resistance region responsive to the second electric field having a pulse width of greater than 400 ns. In other aspects, the second electric field has a pulse width in the range of 400 ns to 10 microsecond (µs). In some aspects, the first EPVR layer 404 has a low-resistance region responsive to a second electric field in the range of 0.05 MV/cm to 0.5 MV/cm. It should be understood that if the EPVR first layer 404 includes high-resistance regions, the second pulsed electric field creates low-resistance regions from the high-resistance regions. If the EPVR first layer 404 initially includes low-resistance regions, the regions remain low-resistance in response to the second pulsed electric field.

The EPVR first and second layers 404/406 each have a resistance of less than 1000 ohms in response to the second pulsed electric field. Only a EPVR second layer 406 with a nano-crystalline structure changes resistance in response to the second pulsed electric field. When the EPVR second layer 406 has an amorphous structure, it maintains a constant resistance responsive to the second pulsed electric field. The concept of resistance remaining constant may be considered to be relative in some aspects of the invention. For example, when the EPVR second layer 406 has an amorphous structure, its resistance that changes by less than a factor of 2, in response to the second pulsed electric field.

FUNCTIONAL DESCRIPTION

Experimental data clearly indicates that the programming pulse window of a well-crystallized $Pr_{0.3}Ca_{0.7}MnO_3$ (PCMO) memory resistor is very narrow. PCMO is a form of CMR material. The programming window can be from a nanosecond to approximately 400 ns. With a nano-crystalline PCMO memory resistor, the programming memory window is in the range of 400 ns, to more than 10 μs. Amorphous CMR does not exhibit memory properties. Therefore, it is possible to fabricate a resistor that has a well-crystallized material at the bottom portion of the resistor, and an amorphous material at the upper portion of the resistor. In this case, the upper portion of the resistor does not respond to a narrow pulse programming (write) process. Only the bottom portion of the resistor has a change in memory, responsive to a narrow pulse. Similarly, it is possible to fabricate resistor random access memory (RRAM) memory resistors with amorphous material as the bottom portion of the resistor, and crystalline material at the upper portion of the resistor. In this case only the upper portion of the resistor exhibits memory properties. In place of amorphous material, nano-crystalline or poor polycrystalline material can be used. As long as the so-called polycrystalline portion of the resistor is a significantly better crystallite, the memory shall work.

Referring to FIG. 3, the memory cell is easily be fabricated by depositing the lower portion of memory resistor CMR material at high temperature, and depositing the upper portion of CMR material at lower temperature.

FIGS. 4A and 4B illustrate the programming of the present invention memory cell to low-resistance and high-resistance states, respectively.

FIG. 5 is a flowchart illustrating the present invention method for forming an asymmetric crystalline structure memory cell. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method begins at Step 500. Step 502 forms a bottom electrode. Step 504 forms an electrical pulse various resistance (EPVR) first layer having a polycrystalline structure overlying the bottom electrode. Step 506 forms an EPVR second layer adjacent the first layer, having either a nano-crystalline or amorphous structure. In some aspects, the second layer overlies the first layer. Note however, that Step 504 may occur after Step 506 in alternate aspects of the method. The EPVR first and second layers formed in Steps 504 and 506 are a material such as CMR, HTSC, or perovskite metal oxide materials.

Step 508 forms a top electrode overlying the EPVR first and second layers. In some aspects, the top electrode formed in Step 508 and the bottom electrode formed in Step 502 are a material such as Pt, TiN, TaN, TiAlN, TaAlN, Ag, Au, or Ir. Note that the top and bottom electrodes can be different materials.

In one aspect of the invention, forming an EPVR first layer having a polycrystalline structure in Step 504 includes depositing the EPVR first layer with a metalorganic spin coat (MOD) process at a temperature of greater than 550 degrees C. In other aspects, the EPVR first layer is deposited with a MOD process at a temperature in the range between 550 and 700 degrees C. This aspect may include a further step, Step 505 (not shown), of heating the MOD deposited EPVR first layer to remove solvents. Then, forming an EPVR second layer adjacent the first layer in Step 506 includes forming the second layer overlying the first layer at a temperature less than, or equal to the 550 degrees C.

In a different aspect, forming an EPVR first layer having a polycrystalline structure in Step 504 includes depositing the EPVR first layer with a physical vapor deposition (PVD) process at a temperature of greater than 400 degrees C. In one example, the deposition temperature is in the range between 400 and 700 degrees C. Then, forming an EPVR second layer adjacent the first layer (Step 506) includes forming the second layer with a PVD deposition process at a temperature at least 30 degrees C. lower than the first layer deposition temperature.

More generally, forming an EPVR second layer adjacent the first layer Step 506 includes forming the second layer at a temperature less than, or equal to the deposition temperature of the first layer.

In some aspects, Step 510 applies an electric field to the EPVR first and second layers. Step 512 selectively modifies the resistance of the EPVR first and second layers in response to the pulse width of the electric field. More specifically, when Step 510 applies a first voltage pulse to the EPVR first and second layers, selectively modifying the resistance of the EPVR first and second layers in response to the pulse width of the voltage pulse in Step 512 includes substeps. Step 512a modifies the resistance in the EPVR first layer in response to the first voltage pulse. Step 512b maintains the resistance in the EPVR second layer in response to the first voltage pulse. In some aspects, the EPVR second layer resistance is maintained within a factor of 2.

In some aspects, Step 510 applies a negative first voltage pulse to the top electrode. Then, modifying the resistance of the EPVR first layer in response to the first voltage pulse includes creating a high-resistance region in the EPVR first layer in response to the negative first voltage pulse. In other aspects, applying a voltage pulse to the EPVR first and second layers includes applying a positive first voltage pulse to the top electrode. Then, modifying the resistance of the EPVR first layer in response to the first voltage pulse includes creating a low-resistance region in the EPVR first layer in response to the positive first voltage pulse.

Some aspects of the method include a further step, Step 514, of applying a second voltage pulse, having a longer pulse width than the first voltage pulse, to the EPVR first and second layers. Then, selectively modifying the resistance of the EPVR first and second layers in response to the pulse width of the voltage pulse (Step 512) includes creating a low-resistance state in the EPVR first and second layers in response to the second voltage pulse.

More specifically, a low-resistance state is created in the EPVR first layer in response to the second voltage pulse. When, an amorphous EPVR second layer is formed in Step 506, then Step 512 maintains the resistance state of the amorphous EPVR second layer in response to the second voltage pulse.

In some aspects, applying a first voltage pulse to the EPVR first and second layers in Step 510 includes applying a first electric field with a pulse width of less than 400 nanoseconds (ns). Typically, the first electric field has a pulse width in the range of 1 ns to 400 ns.

In some aspects, applying a second voltage pulse to the EPVR first and second layers in Step 514 includes applying a second electric field with a pulse width of greater than 400 ns. Typically, the second electric field has a pulse width in the range of 400 ns to 10 microsecond (µs).

In some aspects, applying the negative first voltage pulse in Step 510 includes applying a pulsed electric field in the range of 0.1 megavolts per centimeter (MV/cm) to 0.4 MV/cm. Then, modifying the resistance through the EPVR first layer in response to the first voltage pulse (Step 512a) includes modifying the resistance within a range of 100 ohms to 10 megaohms (Mohms) in response to the negative first voltage pulse. As above the field direction is defined from the perspective of the electrode in contact with the EPVR second layer. In some aspects, applying the positive first voltage pulse in Step 510 includes applying a pulsed electric field in the range of 0.1 megavolts per centimeter (MV/cm) to 0.4 MV/cm. Then, modifying the resistance through the EPVR first layer in response to the first voltage pulse (Step 512a) includes modifying the resistance within a range of 100 ohms to 1000 ohms in response to the positive first voltage pulse.

In other aspects, applying the second voltage pulse in Step 514 includes applying an electric field in the range of 0.05 Mv/cm to 0.5 MV/cm. Then, creating a low resistance state in the EPVR first layer in response to the second voltage pulse (Step 512) includes creating a EPVR first layer resistance of less than 1000 ohms. When Step 506 forms an amorphous EPVR second layer, and the same second field is applied, Step 512 maintains a resistance in the EPVR second layer of less than 1000 ohms. In other aspects, the amorphous EPVR second layer resistance is maintained within a factor of 2.

An asymmetric crystalline structure memory cell and method of forming asymmetric crystalline memory cells have been provided. Some examples have been used to illustrate the invention. However, the invention is not limited to merely these examples. Other variations and embodiments of the invention will occur to those skilled in the art.

We claim:

1. An asymmetric crystalline structure memory cell, the cell comprising:
    a bottom electrode;
    an electrical pulse various resistance (EPVR) material first layer having a polycrystalline structure overlying the bottom electrode, without an interposing amorphous EPVR layer;
    an EPVR second layer adjacent the first layer, having a structure selected from the group including nano-crystalline and amorphous;
    a top electrode overlying the EPVR first and second layers;
    wherein the EPVR first layer has a resistance within a first resistance range, responsive to a pulsed electric field; and,
    wherein the EPVR second layer has a resistance within a second resistance range, responsive to a pulsed electric field.

2. The memory of claim 1 wherein the EPVR first layer has a resistance within the first resistance range, responsive to a first pulsed electric field.

3. The memory cell of claim 2 wherein the EPVR first layer first resistance range is within a range of 100 ohms to 10 megaohms (Mohms) in response to applying a negative first electric field in the range of 0.1 megavolts per centimeter (MV/cm) to 0.4 MV/cm.

4. The memory cell of claim 2 wherein the EPVR first layer first resistance range is within a range of 100 ohms to 1000 ohms in response to applying a positive first electric field in the range of 0.1 megavolts per centimeter (MV/cm) to 0.4 MV/cm.

5. The memory cell of claim 2 wherein the EPVR second layer has a resistance non-responsive to the first pulsed electric field.

6. The memory cell of claim 5 wherein the EPVR second layer has a resistance that changes by less than a factor of 2, in response to a first pulsed electric field.

7. The memory cell of claim 5 wherein the EPVR first and second layers have low-resistance regions responsive to a second pulsed electric field, having a longer pulse width than the first electric field.

8. The memory cell of claim 7 wherein the first EPVR layer has a low-resistance region responsive to the second electric field having a pulse width of greater than 400 ns.

9. The memory cell of claim 8 wherein the first EPVR layer has a low-resistance region responsive to the second electric field having a pulse width in the range of 400 ns to 10 microsecond (µs).

10. The memory cell of claim 7 wherein the first EPVR layer has a low-resistance region responsive to a second electric field in the range of 0.05 MV/cm to 0.5 MV/cm.

11. The memory cell of claim 7 wherein the EPVR first and second layers each have low-resistance regions with a resistance of less than 1000 ohms in response to the second pulsed electric field.

12. The memory cell of claim 7 wherein the EPVR second layer has an amorphous structure and maintains a resistance non-responsive to the second pulsed electric field.

13. The memory cell of claim 12 wherein the EPVR second layer has an amorphous structure with a resistance that changes by less than a factor of 2, in response to the second pulsed electric field.

14. The memory cell of claim 12 wherein the EPVR first layer has a resistance with the first range of resistance values, responsive to the first electric field having a pulse width of less than 400 nanoseconds (ns).

15. The memory cell of claim 14 wherein the EPVR first layer has a resistance with the first resistance range, responsive to the first electric field having a pulse width in the range of 1 ns to 400 ns.

16. The memory cell of claim 1 wherein the EPVR first and second layers are a material selected from the group including colossal magnetoresistance (CMR), high temperature super conductor (HTSC), and perovskite metal oxide materials.

17. The memory cell of claim 1 wherein the bottom electrode is a material selected from the group including Pt, TiN, TaN, TiAlN, TaAlN, Ag, Au, and Ir; and,
    wherein the top electrode is a material selected from the group including Pt, TiN, TaN, TiAlN, TaAlN, Ag, Au, and In.

* * * * *